(12) United States Patent
Frangioso, Jr. et al.

(10) Patent No.: US 7,722,359 B1
(45) Date of Patent: May 25, 2010

(54) CONNECTION ASSEMBLY HAVING MIDPLANE WITH ENHANCED CONNECTION AND AIRFLOW FEATURES

(75) Inventors: Ralph C. Frangioso, Jr., Franklin, MA (US); Robert Wierzbicki, Worcester, MA (US)

(73) Assignee: EMC Corporation, Hopkinton, MA (US)

( * ) Notice: Subject to any disclaimer, the term of this patent is extended or adjusted under 35 U.S.C. 154(b) by 181 days.

(21) Appl. No.: 11/862,800

(22) Filed: Sep. 27, 2007

(51) Int. Cl.
*H01R 12/10* (2006.01)

(52) U.S. Cl. .................... 439/61; 361/695; 361/679.49; 361/679.48

(58) Field of Classification Search ................ 361/694, 361/695, 679.46, 679.47, 679.48, 679.49; 454/184; 439/61
See application file for complete search history.

(56) References Cited

U.S. PATENT DOCUMENTS

| | | | |
|---|---|---|---|
| 6,778,386 B2 | 8/2004 | Garnett et al. | |
| 6,869,314 B2 | 3/2005 | Garnett et al. | |
| 6,927,975 B2 * | 8/2005 | Crippen et al. | 361/679.49 |
| 6,961,242 B2 * | 11/2005 | Espinoza-Ibarra et al. | 361/695 |
| 7,262,962 B1 * | 8/2007 | McLeod et al. | 361/679.48 |
| 7,280,356 B2 * | 10/2007 | Pfahnl et al. | 361/695 |
| 7,295,446 B2 | 11/2007 | Crippen et al. | |
| 7,516,272 B2 * | 4/2009 | Felton et al. | 711/112 |

\* cited by examiner

*Primary Examiner*—Xuong M Chung-Trans
(74) *Attorney, Agent, or Firm*—BainwoodHuang (57) ABSTRACT

A connection assembly has a midplane, first midplane connectors and second midplane connectors. The midplane is divided into an airflow section and a connector section by a dividing line. The midplane defines a first side and a second side which faces away from the first side. The airflow section provides airflow passageways connecting spaces on both sides of the midplane. The connector section provides (i) first mounting locations which are confined to the connector section on the first side and (ii) second mounting locations which are confined to the connector section on the second side. The first midplane connectors are arranged to connect to first circuit board modules, and are mounted over the first mounting locations on the first side. The set of second midplane connectors are arranged to connect to second circuit board modules, and are mounted over the second mounting locations on the second side.

20 Claims, 5 Drawing Sheets

CONNECTION ASSEMBLY HAVING MIDPLANE WITH ENHANCED CONNECTION AND AIRFLOW FEATURES

BACKGROUND

In general, a midplane is a circuit board which connects to other circuit boards on each side. Midplanes are often used in data storage systems where one side of the chassis accepts processing cards (e.g., storage processors) and the other side of the chassis accepts other types of cards such as I/O cards, service modules and power supplies. Midplanes are suitable for use in other types of systems as well such as networking systems.

One conventional computerized system has a midplane which is vertically oriented within its enclosure which accommodates horizontal airflow. Horizontally oriented processing boards insert through one side of the enclosure and connect to one side of the midplane. Vertically oriented disk drives insert through the other side of the enclosure and connect to the other side of the midplane. The midplane defines a series of narrow air slots which enable air to pass between the processing board side of the midplane and the disk drive side of the midplane for cooling purposes. Elongated disk drive connectors are interleaved between the narrow air slots to enable the disk drives to electrically connect to the midplane without blocking the narrow air slots.

Other conventional computerized systems have midplanes which are oriented so that the midplanes do not fully extend (i.e., from the top to the bottom, and from side to side) within horizontal airflow enclosures (e.g., a midplane can lay flat on the bottom of the enclosure). In such a configuration, air is allowed to flow around the midplane (e.g., from the front of the enclosure over the midplane to the back).

SUMMARY

Unfortunately, there are drawbacks to the above-described conventional midplane configurations. In particular, the above-described midplane which defines a series of narrow air slots does not provide an ideal balance between airflow and connector density in certain situations. For example, in the above-described conventional computerized system having disk drives, suppose that a design engineer wanted to implement a similar system but wanted to replace the disk drives on one side of the midplane with additional circuit boards such as paddle cards. Further suppose that the additional paddle cards imposed greater connection and cooling demands than the disk drives. Unfortunately, due to the interleaving of narrow air slots and connectors on the above-described conventional midplane, there is substantial circuit board real estate required for copper traces leading to and from each connector and the various other locations on the midplane. As a result, the placement of such traces to the connectors between the air slots would restrict the size (e.g., width) of the air slots. One way to address this situation is to increase fan strength (e.g., size, speed, etc.), as well as the size of the power supplies driving the fans, in order to force more air through the narrow air slots for adequate cooling. Unfortunately, this solution may be unacceptable to the design engineer in view of certain cost, density and space requirements.

Another way to address this situation would be to lower the paddle card density (i.e., remove a paddle card or two and the corresponding connectors from the design) thus reducing the demand for midplane real estate and enabling allocation of more space for the air slots, i.e., there would then be more space on the midplane for larger vent holes. Unfortunately, this solution results in a less competitive product (e.g., less paddle cards with lower total processing capacity).

Yet another way to address this situation would be to make the height of the midplane taller in an attempt to preserve the number of paddle cards and preserve the horizontal form factor. Unfortunately, this solution, which would still involve interleaved air slots and connectors, would still possess non-optimal shaped air slots (i.e., tall and narrow) due to the need to run signal traces to the interleaved connectors. Furthermore, in certain environments such as a standard equipment rack, the taller form factor would reduce the overall density of the rack mounted equipment.

Additionally, the above-described conventional midplane, which is oriented so that the midplane does not fully extend to all sides within the enclosure, has the disadvantage of providing sub-optimal connecting capabilities. For example, if the midplane is oriented horizontally or made to be only a fraction of the height of the enclosure (e.g., a half-height midplane), the air flow through the enclosure may be adequate, but the amount of midplane real estate for supporting connectors and traces is significantly limited.

In contrast to the above-described conventional midplane situations, an improved connection assembly utilizes a midplane having an airflow section and a connector section divided by a dividing line. The airflow section is arranged to provide airflow passageways which connect spaces on both sides of the midplane. The connector section is arranged to provide mounting locations on both sides of the midplane. Such an arrangement offers the ability to connect circuitry on both sides of the midplane in a high density manner but nevertheless achieve robust and reliable airflow from one side to the other for a variety of electronic applications.

One embodiment is directed to a connection assembly having (i) a midplane, (ii) first midplane connectors and (iii) second midplane connectors. The midplane is divided into an airflow section and a connector section by a dividing line, i.e., a substantially straight boundary horizontally extending along the midplane. The midplane defines a first side and a second side which faces away from the first side. The airflow section provides airflow passageways which connect spaces on both sides of the midplane. The connector section provides (i) first mounting locations which are confined to the connector section on the first side and (ii) second mounting locations which are confined to the connector section on the second side. The first midplane connectors are arranged to connect to first circuit board modules, and are mounted over the first mounting locations on the first side. The set of second midplane connectors are arranged to connect to second circuit board modules, and are mounted over the second mounting locations on the second side.

BRIEF DESCRIPTION OF THE DRAWINGS

The foregoing and other objects, features and advantages will be apparent from the following description of particular embodiments of the invention, as illustrated in the accompanying drawings in which like reference characters refer to the same parts throughout the different views. The drawings are not necessarily to scale, emphasis instead being placed upon illustrating the principles of various embodiments of the invention.

DETAILED DESCRIPTION

An improved connection assembly utilizes a midplane having an airflow section and a connector section divided by a midline. The airflow section is arranged to provide enhanced airflow passageways which connect spaces on both sides of the midplane. The connector section is arranged to provide mounting locations on both sides of the midplane. Such an arrangement offers the ability to connect circuitry on both sides of the midplane in a high density manner but nevertheless achieve robust and reliable airflow from one side to the other for a variety of electronic applications.

Figure 1:
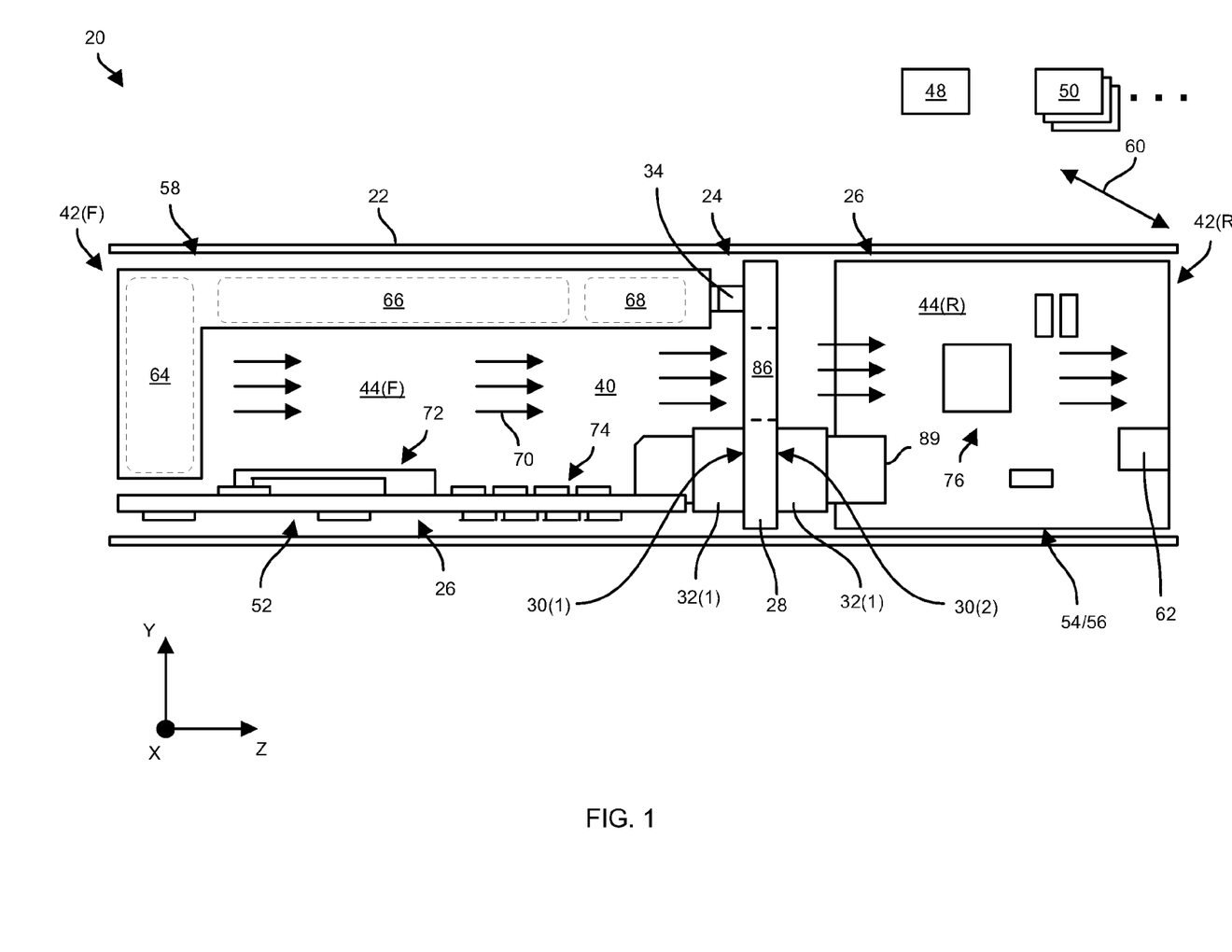
FIG. 1 is a cross-sectional side view of an electronic system having a midplane with separate airflow and connector sections.
Figure 2:
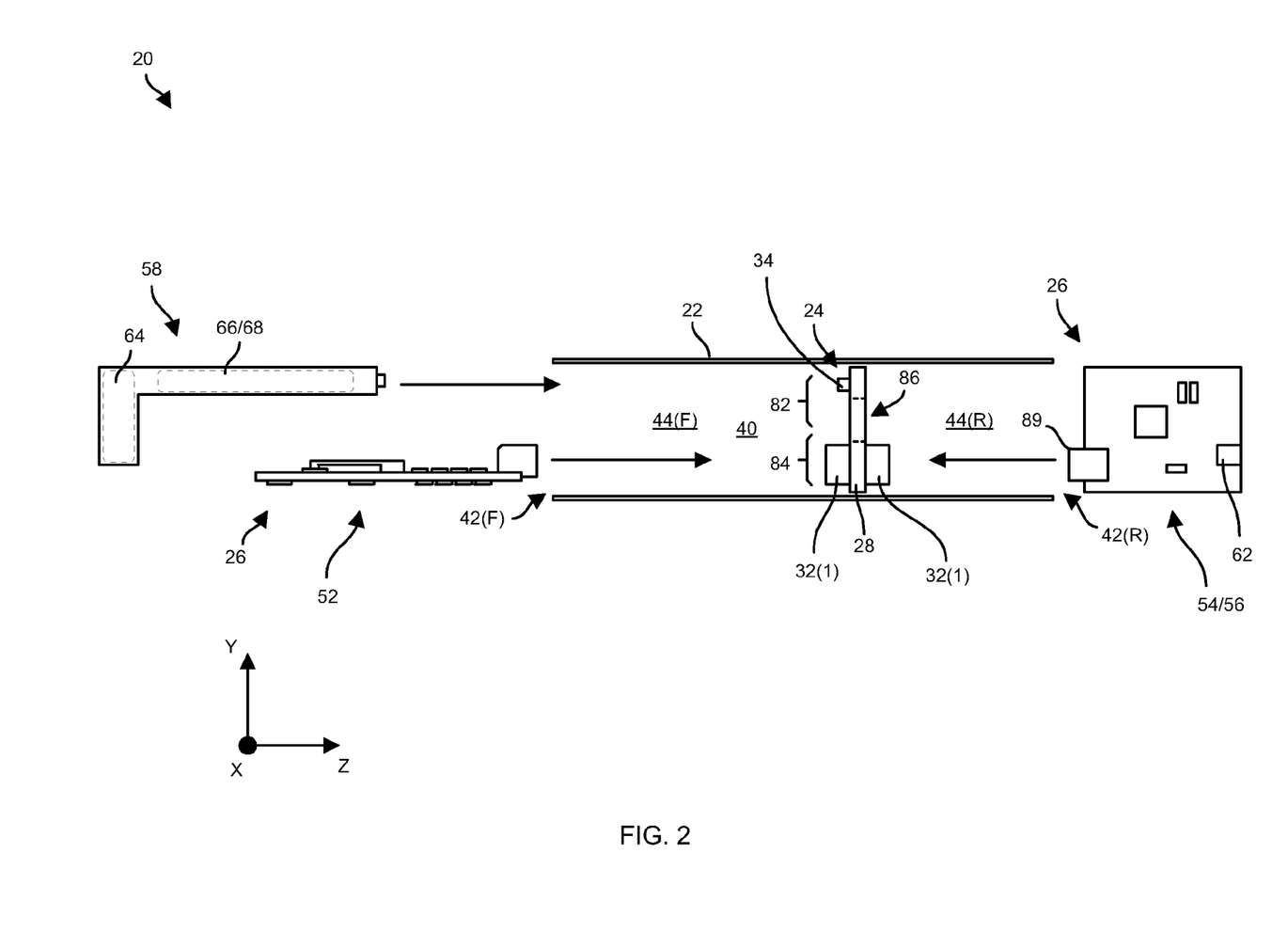
FIG. 2 is an exploded view of the electronic system of FIG. 1.
Figure 3:
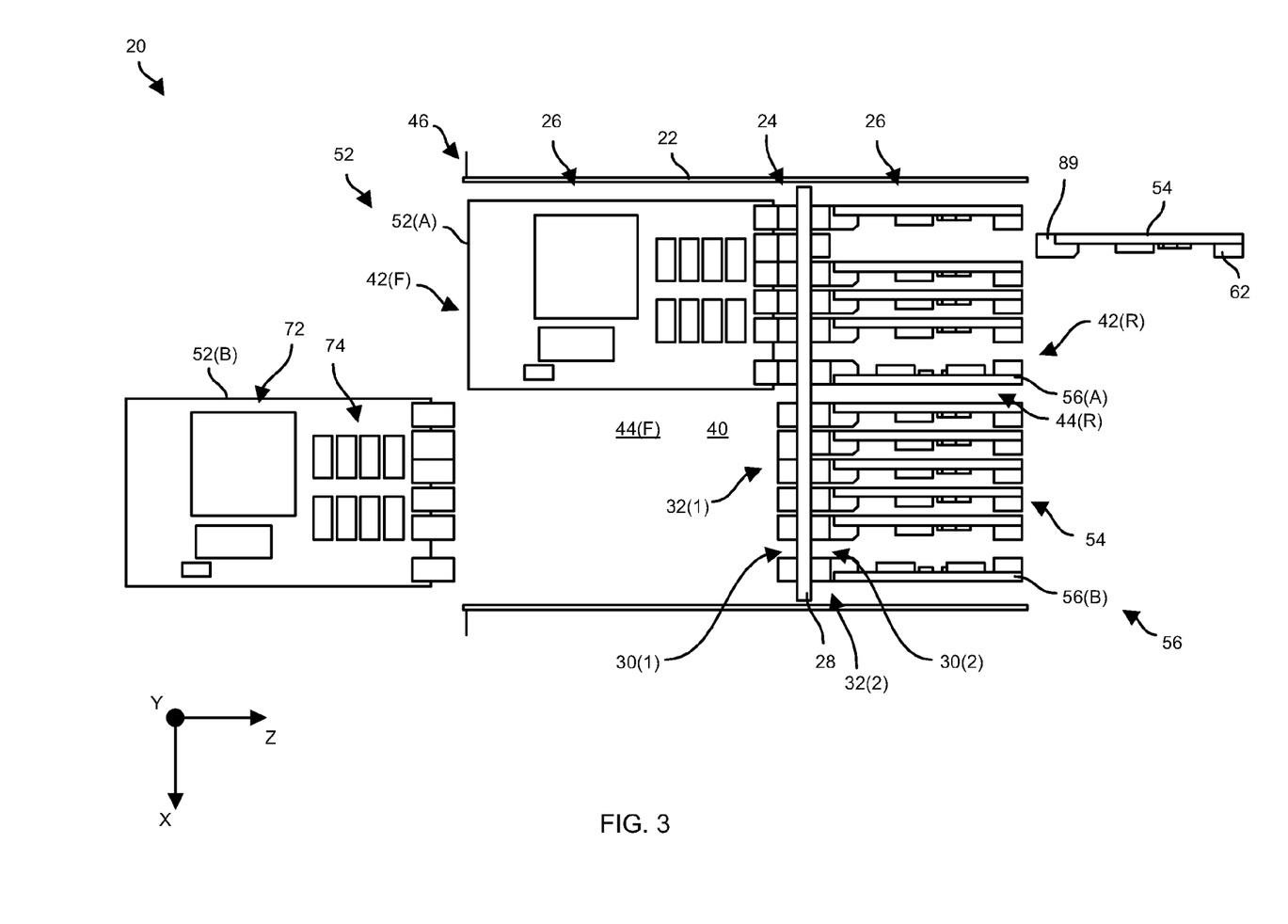
FIG. 3 is a cross-sectional top view of the electronic system of FIG. 1.

FIGS. 1 through 3 show various features of an electronic system 20 which utilizes a midplane having enhanced connection and airflow features. FIG. 1 is a cross-sectional side view of the electronic system 20. FIG. 2 is an exploded view of the electronic system 20. FIG. 3 is a cross-sectional top view of the electronic system 20.

As shown, the electronic system 20 includes a chassis 22, a connection assembly 24, and a variety of modules 26 (e.g., motherboards, daughter cards, etc.). As will be explained in further detail shortly with reference to FIG. 4, the connection assembly 24 includes (i) a midplane 28 defining a first side 30(1) and a second side 30(2), (ii) first midplane connectors 32(1) mounted to the first side 30(1) (e.g., a motherboard side), and (iii) second midplane connectors 32(2) mounted to the second side 30(2) (e.g., a daughter card side). The connection assembly 24 further includes power connectors 34 (FIGS. 1 and 2) which are also mounted to the first side 30(1).

The chassis 22 defines an internal space 40, a front opening 42(F) and a rear opening 42(R). The chassis 22 is arranged to support the midplane 28 in a substantially vertical orientation within the internal space 40 in a manner that partitions the internal space 40 into a front cavity 44(F) which is accessible through the front opening 42(F) and a rear cavity 44(R) which is accessible through the rear opening 42(R). In FIGS. 1 through 3, the midplane 28 extends in the X-Y plane.

In some arrangements, the chassis 22 is arranged as a rack mount enclosure having rack mount features 46 such as flanges having screw holes (FIG. 3) thus enabling the chassis 22 to mount with one or more other enclosures on an electronic equipment rack. In such arrangements, the modules 26 preferably are arranged to connect and disconnect from the connection assembly 24 in a hot-swappable manner (e.g., as field replaceable units) for improved serviceability. In some arrangements, the chassis 22 defines a 2U tall form factor in the Y-direction to provide an efficient, high density electronic configuration.

It should be understood that the arrangement of modules 26, as shown in FIGS. 1-3, is particularly well-suited for an electronic system having a few primary circuit boards running hot processing ICs, and a disproportionately higher number of daughter boards having lower-lying ICs with more uniform cooling requirements. Along these lines, the front cavity 44(F) offers space for a relatively small number of horizontally oriented motherboards having relatively tall structures (e.g., socketed microprocessors having heat sinks) since the front cavity is close to the air flow source and since the front cavity 44(F) provides ample height that allows the tall structures to conveniently extend into the main air flow.

Furthermore, the rear cavity 44(R) enjoys air flow that is substantially symmetric and uniform thus making this area ideal for smaller-sized vertically oriented circuit boards with non-socketed (e.g., soldered) components which are close to the boards since these smaller-sized circuit boards can be densely stacked in a parallel manner and placed within direct sight of that symmetric and uniform air flow.

In a particular embodiment, the electronic system 20 is arranged to operate as a high-availability data storage system with fault tolerant capabilities. In such an embodiment, the electronic system 20 carries out data storage operations on an array of external storage devices 48 (e.g., magnetic disk drives, flash memory drives, etc.) on behalf of a set of host computers 50 (FIG. 1). To this end, the modules 26 include multiple storage processor modules 52(A), 52(B) (collectively, storage processors 52), multiple input/output (I/O) modules 54, multiple management modules 56(A), 56(B), and multiple fan/power supply assemblies 58 (omitted from FIG. 3 to show other details of the system 20).

The storage processors 52 are arranged to perform data storage operations on the array of storage devices 48 in response to data storage requests from the host computers 50. The I/O modules 54 operate as interfaces between the storage processors 52 and the various external devices such as the storage device array 48 and the host computers 50, e.g., by sending and receiving communications signals 60 through ports 62. The management modules 56(A), 56(B) enable a user (e.g., an administrator, a technician, etc.) to monitor and control the electronic system 20. The fan/power supply assemblies include fans 64, power supplies 66 and other circuitry 68 (e.g., environmental sensors) to control the operating environment of the electronic system 20.

As best seen in FIG. 2, the storage processors 52 insert in the positive Z-direction into the front cavity 44(F) through the front opening 42(F) to engage with the first midplane connectors 32(1). When the storage processors 52 are properly connected to the connection assembly 24 within the chassis 22, the storage processors 52 extend horizontally and in a coplanar manner in an X-Z plane (e.g., see FIG. 3). The redundant storage processors 52 provide fault tolerance and load balancing advantages to the system 20.

The fan/power supply assemblies 58 also insert in the positive Z-direction into the front cavity 44(F) through the front opening 42(F) to engage with the power connectors 34. As best seen in FIG. 1, the particular placement of the fans 64 and the power supplies 66 enables the fans 64 to generate robust airflow 70 which passes through passageways 86 within the midplane 28. In particular, the airflow 70 passes over the storage processors 52, e.g., over processors 72 and semiconductor memory 74, as well as other circuitry 76 on the other modules 26. Preferably, there are multiple fan/power supply assemblies 58 and the system 20 is able to continue operating as a whole in the event of a failure of a fan/power supply assembly 58.

In some arrangements, the processors 72 (e.g., socketed microprocessors with associated heat sinks) substantially extend from the X-Z plane of the board in the positive Y-direction. Such processors 72, as well as the other storage processor circuitry, enjoy close positioning to the fans 64 for reliable cooling within the main air flow 70 but in a manner that does not substantially impede the air flow 70 downstream.

Additionally, the I/O modules 54 and the management modules 56(A), 56(B) insert in the negative Z-direction into the rear cavity 44(R) through the rear opening 42(R) to engage with the second midplane connectors 32(2) (e.g., see FIG. 2). When the I/O modules 54 and the management modules 56(A), 56(B) are properly connected to the connection assembly 24 within the chassis 22, the I/O modules 54 and the management modules 56(A), 56(B) extend vertically in parallel Y-Z planes. By way of example only, the data storage system includes ten (10) I/O modules 54 and two (2) management modules 56(A), 56(B) for high density connectivity to the I/O modules 54 (and perhaps the storage processors 52) on the system (FIG. 3). The primary component side of the management modules 56(A), 56(B) is flipped compared to the primary component side of the I/O modules 54 to advantageously position the components of the management modules 56(A), 56(B) within the air flow 70.

As mentioned earlier, there may be a disproportionately higher number of I/O modules 54 and management modules 56(A), 56(B) which reside in parallel placement relative to each other within a substantially symmetric and uniform air flow 70. In some arrangements, the modules 54, 56(A), 56(B) are characterized by low component height and short proportional length (e.g., to keep the overall chassis length to a 24 inch depth). Nevertheless, the modules 54, 56(A), 56(B) enjoy robust cooling due to positioning of module components in direct sight of the air flow 70 as it passes through the midplane 28. As a result, there is healthy thermal support for a high density of daughter card style boards in the rear cavity 44(R). Further details will now be provided with reference to FIG. 4.

Figure 4:
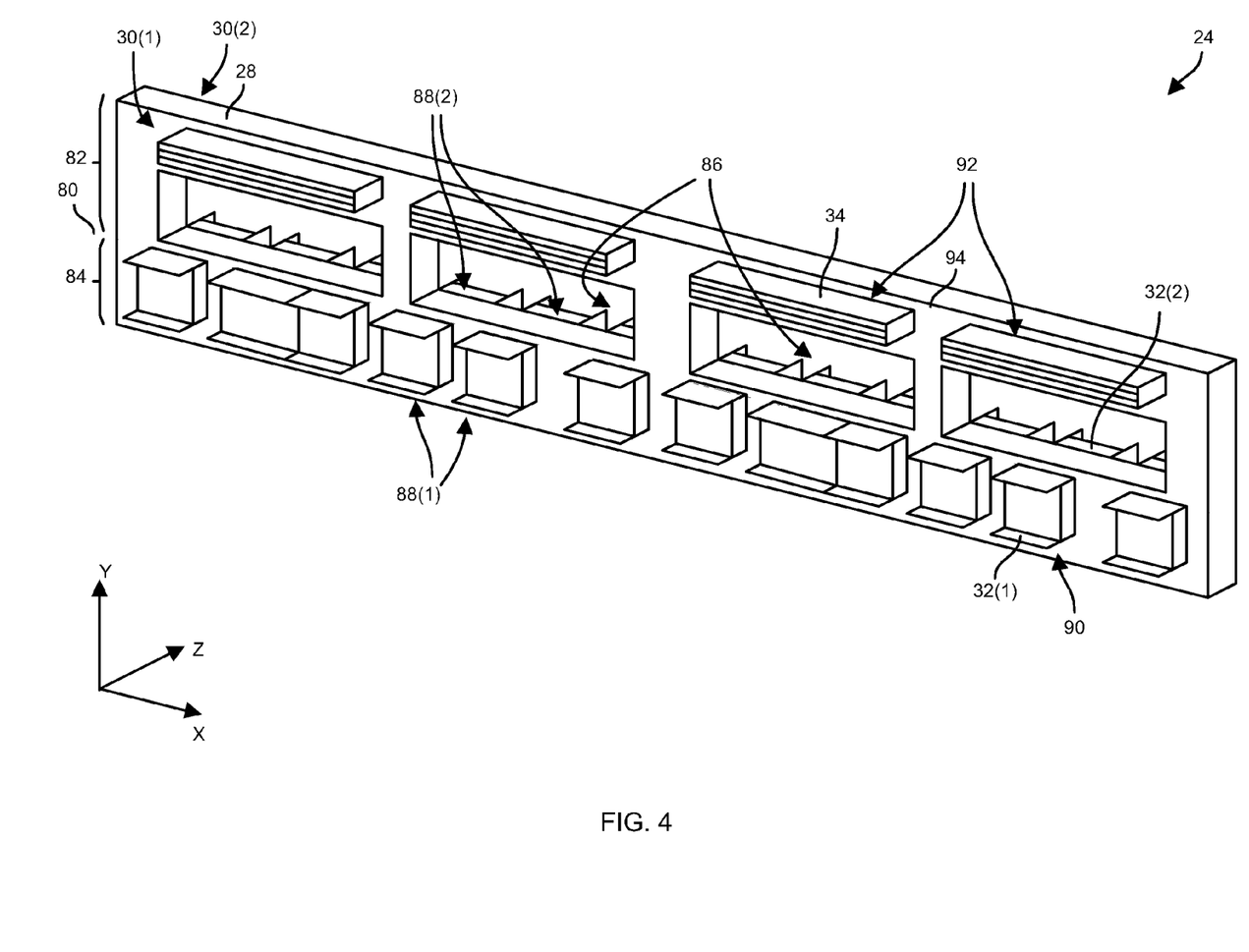
FIG. 4 is a perspective view of a motherboard side of a connection assembly of the electronic system of FIG. 1.

FIG. 4 is a perspective view of the motherboard side of the connection assembly 24 which is arranged to interconnect the storage processor modules 52, the I/O modules 54, the management modules 56, and the fan/power supply assemblies 58 (also see FIGS. 1 through 3). Along these lines, the midplane 28 of the connection assembly 24 is elongated in shape and extends along the X-axis. Additionally, a dividing line 80 extends in the same direction, i.e., along the X-axis and divides the midplane into an airflow section 82 and a connector section 84 (also see FIG. 2). The dividing line 80 is essentially a substantially uniform and straight boundary between the two sections 82, 84 to largely segregate the connectors 32 to a particular region (e.g., the lower region) of the connection assembly 24.

The airflow section 82 provides a set of airflow passageways 86 which connect an air space adjacent the first side 30(1) of the midplane 28 to an air space adjacent the second side 30(2) of the midplane 28 (see the spaces 44(F) and 44(R) in FIG. 1). As will be explained in further detail shortly, the airflow passageways 86 are not hindered by connectors and traces on PCB material as in conventional midplane designs which interleave connectors and their associated traces with narrow air slots.

Additionally, the connector section 84 provides first mounting locations 88(1) which are confined to the connector section 84 on the first side 30(1). In particular, the first mounting locations 88(1) are arranged in a single row along the X-axis. Accordingly, the first midplane connectors 32(1) mount over the first mounting locations 88(1) and form a single row of first midplane connectors 88(1) thus enabling robust and reliable connection between the midplane 28 and the storage processors 52 which lay horizontally in a coplanar manner (also see FIGS. 1-3).

Similarly, the connector section 84 further provides second mounting locations 88(2) which are confined to the connector section 84 on the second side 30(2). In particular, the second mounting locations 88(2) are arranged in a single row along the X-axis. Accordingly, the second midplane connectors 32(1) mount over the second mounting locations 88(2) and form a single row of second midplane connectors 88(2) thus enabling the I/O modules 54 and the management modules 56 to connect to the same connector section 84 of the midplane 28 as the storage processors 52 (i.e., bottom area).

It should be understood that the bottom-lower corners of the modules 54, 56 present advantageous locations for matching connectors 89 which connect to the midplane connectors 32(2) on the second side 30(2) of the midplane 28. In particular, such positioning of the connectors 89 places the connectors 89 out of the way of the airflow 70 in substantially the same plane as the storage processors 52. That is, the connectors 89 of the modules 54, 56 are coplanar with the storage processors 52 thus minimizing obstruction of the airflow 70.

In some arrangements, there are shared plated through holes (PTHs) 90 (illustrated generally by the arrow 90 in FIG. 4) within the connection section 84 which engage pins of both a first midplane connector 32(1) and a second midplane connector 32(2) concurrently. In one arrangement, each first midplane connector 32(1) and each second midplane connector 32(2) connect to at least one shared PTH 90. The restriction of the midplane connectors 32 to the connector section 84 frees the airflow section 82 to provide the relatively large airflow passageways 86 for robust and reliable airflow through the connection assembly 24.

Nevertheless, it should be understood that the airflow section 82 is capable of providing mounting locations and supporting components as well. For example, as further illustrated in FIG. 4, the airflow section 82 of the midplane 28 provides a set of power supply connector mounting locations 92 between the airflow passageways 86 and a top edge 94 which allows the power supply connectors 34 to mount on the first side 30(1) of the midplane 28 in an out-of-the-way manner, i.e., without obstructing the airflow passageways 86.

It should be understood that, in some arrangements, the dividing line 80 is substantially near the midline or bisecting line of the midplane 28 so that the airflow section 82 and the connection section 84 are roughly equal. In other arrangements, the dividing line 80 is further toward the top or bottom of the midplane 28 making one of the two sections 82, 84 larger than the other. For the connection assembly 24, the particular placement of the dividing line 80 is dependent on the particular design tradeoffs between connecting density requirements and airflow/cooling requirements.

It should be further understood that, despite the orthogonal orientations between the motherboard-style modules 26 (e.g., storage processors 52) and the midplane 28 on one side, and the orthogonal orientations between the daughter card style modules 26 (e.g., I/O modules 54 and management modules 56) on the other side of the midplane 28, the air passageways 86 of the connection assembly 24 allow for robust and reliable laminar airflow through the chassis 22. Further details will now be provided with reference to FIG. 5.

Figure 5:
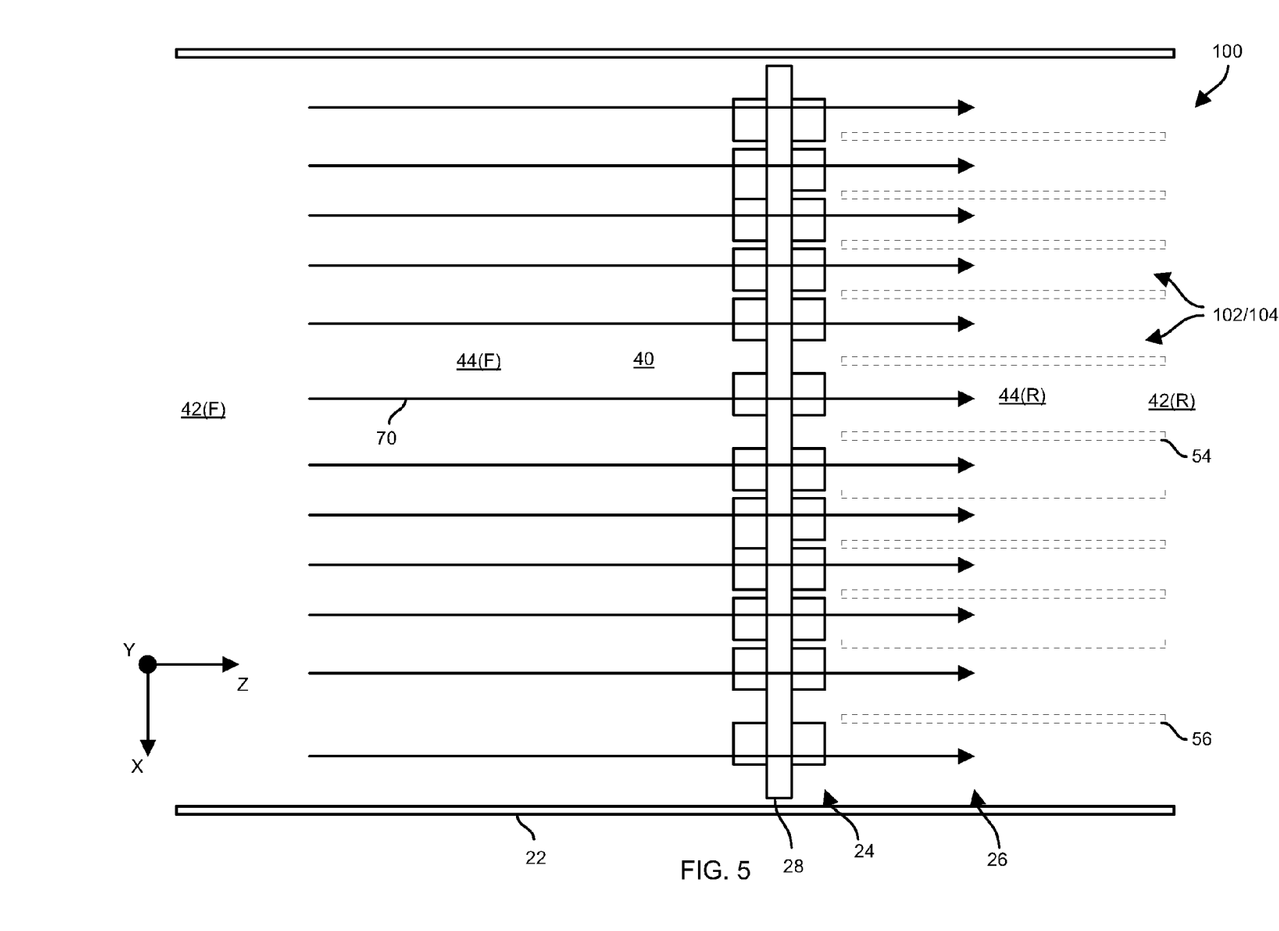
FIG. 5 is a map illustrating airflow pathways through various portions of the electronic system of FIG. 1.

FIG. 5 is a map 100 illustrating airflow pathways 102 through the system 20 during operation. The I/O modules 54 and the management modules 56 are shown in phantom in FIG. 5 (also see FIGS. 1-3) to better illustrate channeling aspects of the airflow pathways 102. That is, as the airflow 70 from the fans 64 (FIG. 1) passes in the positive Z-direction through the passageways 86 of the midplane 86 (FIG. 4), the airflow 70 is allowed to separate into vertical channels 104 defined by the modules 54, 56. Although the modules 54, 56 are orthogonal to the midplane 28, air is still capable of flowing with minimal turbulence through the channels 104 thus effectively and efficiently removing heat from the circuitry of the system 20.

As described above, an improved connection assembly 24 utilizes a midplane 28 having an airflow section 82 and a connector section 84 divided by a dividing line 80. The airflow section 82 is arranged to provide airflow passageways 86 which connect spaces 44(F), 44(R) on both sides of the midplane. The connector section 84 is arranged to provide mounting locations 88 on both sides of the midplane. Such an arrangement offers the ability to connect circuitry on both sides of the midplane in a high density manner but nevertheless achieve robust and reliable airflow from one side to the other for a variety of electronic applications.

While various embodiments of the invention have been particularly shown and described, it will be understood by those skilled in the art that various changes in form and details may be made therein without departing from the spirit and scope of the invention as defined by the appended claims.

For example, it should be understood that the above-described arrangement of modules 26 within the chassis 22 lends itself extremely well for certain types of electronic systems 20 such as processing engines which have a few motherboards (i.e., the storage processors 52) and a much larger number of daughter cards (i.e., the I/O modules 54 and management modules 56(A), 56(B) for getting a variety of communications to and from the storage processors 52). In particular, such an arrangement naturally supports a simple and effective migration/scalability path.

For example, a user of the electronic system 20 may start with only the two management modules 56(A), 56(B) and a few I/O modules 54 (e.g., see FIG. 3). The remaining locations for I/O modules 54 initially could be filled with filler panels (e.g., inactive panels) to maintain the evenness of the air flow 70 and to provide EMI shielding within the rear cavity 44(R).

At a later time, when the user wishes to expand the system 20, the user can simply replace the filler panels with additional I/O modules 54 without the need for swapping out any existing I/O modules 54. Each I/O module can provide a different type of connectivity (e.g., SAS, Fibre Channel, TCP/IP, etc.) thus enabling the user to select different I/O modules 54 and tailor the system 20 to specific needs of the system 20 on an incremental upgrade basis. Moreover, the user can add the I/O modules 54 while the system 20 remains up and running via hot-insertion (e.g., as a field replaceable unit). Accordingly, the system 20 achieves high availability (i.e., no downtime) and the ability to scale in a variety of different directions (i.e., the user can pick and choose which I/O modules 54 are best suited for the particular needs of the system 20).

What is claimed is:

1. A connection assembly, comprising:
a midplane which is divided into an airflow section and a connector section by a dividing line extending along an X-axis of the midplane, the connector section being segregated from and disposed in a single region of the midplane by the dividing line, the midplane further defining a first side and a second side which faces away from the first side, the airflow section of the midplane providing a set of airflow passageways connecting an air space adjacent the first side of the midplane to an air space adjacent the second side of the midplane, the connector section of the midplane providing (i) a set of first mounting locations which is confined to the connector section of the midplane on the first side and (ii) a set of second mounting locations which is confined to the connector section of the midplane on the second side;
a set of first midplane connectors arranged to connect to a set of first circuit board modules, the set of first midplane connectors being mounted over the set of first mounting locations which is confined to the connector section of the midplane on the first side;
a set of second midplane connectors arranged to connect to a set of second circuit board modules, the set of second midplane connectors being mounted over the set of second mounting locations which is confined to the connector section of the midplane on the second side; and
wherein the first midplane connectors and the second midplane connectors are disposed in the single region of the connector section and the airflow passageways exclude connectors and traces in order to minimize the obstruction of airflow through the midplane.

2. A connection assembly as in claim 1, further comprising:
a rack mount chassis defining an internal space, the rack mount chassis being arranged to support the midplane in a substantially vertical orientation within the internal space in a manner that partitions the internal space into (i) a front cavity which is accessible through a front opening of the rack mount chassis and (ii) a rear cavity which is accessible through a rear opening of the rack mount chassis.

3. A connection assembly as in claim 2 wherein, when the rack mount chassis supports the midplane in the substantially vertical orientation within the internal space, the airflow section is disposed above the connector section.

4. A connection assembly as in claim 3 wherein, when the rack mount chassis supports the midplane in the substantially vertical orientation within the internal space, the first midplane connectors are arranged to connect to a set of horizontally oriented motherboards disposed in the front cavity.

5. A connection assembly as in claim 4 wherein, when the rack mount chassis supports the midplane in the substantially vertical orientation within the internal space, the first midplane connectors are arranged to connect to multiple horizontally oriented motherboards which are coplanar with each other.

6. A connection assembly as in claim 5 wherein the airflow section further provides a set of power supply connector mounting locations on the first side between the set of airflow passageways and a top edge of the midplane; and wherein the connection assembly further comprises:
a set of power supply connectors mounted over the set of power supply connector mounting locations on the first side, the set of power supply connectors being arranged to connect to a set of power supply modules disposed in the front cavity adjacent to the set of horizontally oriented motherboards.

7. A connection assembly as in claim 5 wherein, when the rack mount chassis supports the midplane in the substantially vertical orientation within the internal space, the second midplane connectors are arranged to connect to a set of vertically oriented daughter cards disposed in the back cavity, each vertically oriented daughter card being substantially orthogonal to (i) a plane defined by the midplane and (ii) a plane defined by the multiple horizontally oriented motherboards and wherein laminar airflow is provided through airflow pathways and through the airflow passageways to both the horizontally oriented motherboards and vertically oriented daughter cards.

8. A connection assembly as in claim 5 wherein, for each first midplane connector, a shared plated through hole of the connector section concurrently engages a pin of that first midplane connector and a pin of a corresponding second midplane connector.

9. An electronic system, comprising:
a set of first circuit board modules;
a set of second circuit board modules; and a connection assembly arranged to interconnect the set of first circuit board modules with the set of second circuit board modules, the connection assembly including:

a midplane which is divided into an airflow section and a connector section by a dividing line extending along an X-axis of the midplane, the connector section being segregated from and disposed in a single region of the midplane by the dividing line, the midplane defining a first side and a second side which faces away from the first side, the airflow section of the midplane providing a set of airflow passageways connecting an air space adjacent the first side of the midplane to an air space adjacent the second side of the midplane, the connector section of the midplane providing (i) a set of first mounting locations which is confined to the connector section of the midplane on the first side and are arranged into a single row of first mounting locations and (ii) a set of second mounting locations which is confined to the connector section of the midplane on the second side and are arranged into a single row of second mounting locations, a set of first midplane connectors arranged to connect to the set of first circuit board modules, the set of first midplane connectors being mounted over the set of first mounting locations which is confined to the connector section of the midplane on the first side and arranged into a single row of first midplane connectors, a set of second midplane connectors arranged to connect to the set of second circuit board modules, the set of second midplane connectors being mounted over the set of second mounting locations which is confined to the connector section of the midplane on the second side and arranged into a single row of second midplane connectors; and wherein the single row of the first midplane connectors and the single row of the second midplane connectors are disposed in the single region of the connector section which provides high density connections while minimizing the obstruction of airflow through the midplane.

10. An electronic system as in claim 9 wherein the set of first circuit board modules includes multiple storage processor modules arranged to carry out data storage operations; and wherein the set of second circuit board modules includes multiple input/output modules arranged to convey communications between the multiple storage processor modules and a set of external devices.

11. An electronic system as in claim 10 wherein the connection assembly further includes:

a rack mount chassis arranged to position (i) the midplane in a substantially vertical orientation, (ii) the multiple storage processors in a substantially horizontal orientation, the multiple storage processors being substantially orthogonal to a plane defined by the midplane, and (iii) the multiple input/output modules in a substantially vertical orientation, the multiple input/output modules being substantially orthogonal to the plane defined by the midplane.

12. An electronic system as in claim 11 wherein the set of external devices includes an array of storage devices and a set of host computers; and wherein each of the multiple storage processor modules and the multiple input/output modules is hot-swappable with respect to the rack mount chassis to form a high-availability data storage system to carry out data storage operations on the array of storage devices on behalf of the set of host computers.

13. An electronic system as in claim 9 wherein the connection assembly further includes:

a rack mount chassis defining an internal space, the rack mount chassis being arranged to support the midplane in a substantially vertical orientation within the internal space in a manner that partitions the internal space into (i) a front cavity which is accessible through a front opening of the rack mount chassis and (ii) a rear cavity which is accessible through a rear opening of the rack mount chassis.

14. An electronic system as in claim 13 wherein, when the rack mount chassis supports the midplane in the substantially vertical orientation within the internal space, the airflow section is disposed above the connector section.

15. An electronic system as in claim 14 wherein, when the rack mount chassis supports the midplane in the substantially vertical orientation within the internal space, the first midplane connectors are arranged to connect to a set of horizontally oriented motherboards disposed in the front cavity.

16. An electronic system as in claim 15 wherein, when the rack mount chassis supports the midplane in the substantially vertical orientation within the internal space, the first midplane connectors are arranged to connect to multiple horizontally oriented motherboards which are coplanar with each other.

17. An electronic system as in claim 16 wherein the airflow section of the midplane further provides a set of power supply connector mounting locations on the first side between the set of airflow passageways and a top edge of the midplane; and wherein the connection assembly further includes:

a set of power supply connectors mounted over the set of power supply connector mounting locations on the first side, the set of power supply connectors being arranged to connect to a set of power supply modules disposed in the front cavity adjacent to the set of horizontally oriented motherboards.

18. An electronic system as in claim 16 wherein, when the rack mount chassis supports the midplane in the substantially vertical orientation within the internal space, the second midplane connectors are arranged to connect to a set of vertically oriented daughter cards disposed in the back cavity, each vertically oriented daughter card being substantially orthogonal to (i) a plane defined by the midplane and (ii) a plane defined by the multiple horizontally oriented motherboards.

19. An electronic system as in claim 16 wherein, for each first midplane connector, a shared plated through hole of the connector section concurrently engages a pin of that first midplane connector and a pin of a corresponding second midplane connector.

20. A connection assembly, comprising:

a midplane which is divided into an airflow section and a connector section by a dividing line extending along an X-axis of the midplane, the connector section being segregated from and disposed in a single region of the midplane by the dividing line, the midplane further defining a first side and a second side which faces away from the first side, the airflow section of the midplane providing a set of airflow passageways connecting an air space adjacent the first side of the midplane to an air space adjacent the second side of the midplane, the connector section of the midplane providing (i) a set of first mounting locations which is confined to the connector section of the midplane on the first side and arranged in a single row and (ii) a set of second mounting locations which is confined to the connector section of the midplane on the second side and arranged in a single row;

a set of first midplane connectors arranged to connect to a set of first circuit board modules, the set of first midplane connectors being mounted over the set of first mounting locations which is confined to the connector section of the midplane on the first side and arranged in a single row;

a set of second midplane connectors arranged to connect to a set of second circuit board modules, the set of second midplane connectors being mounted over the set of second mounting locations which is confined to the connector section of the midplane on the second side and arranged in a single row; and wherein the single row of first midplane connectors provides a connection between the midplane and one or more storage processors, and wherein the single row of second midplane connectors provides a connection between the midplane and one or more input/output modules and one or more management modules, and wherein the storage processors, input/output modules and management modules are all connected to the same connection section in order to minimize obstruction of airflow.

* * * * *